(12) United States Patent
Ninomiya

(10) Patent No.: US 7,307,310 B2
(45) Date of Patent: Dec. 11, 2007

(54) SEMICONDUCTOR DEVICE AND METHOD FOR MANUFACTURING SAME

(75) Inventor: Hitoshi Ninomiya, Kanagawa (JP)

(73) Assignee: NEC Electronics Corporation, Kawasaki, Kanagawa (JP)

(*) Notice: Subject to any disclaimer, the term of this patent is extended or adjusted under 35 U.S.C. 154(b) by 175 days.

(21) Appl. No.: 11/123,178

(22) Filed: May 6, 2005

(65) Prior Publication Data

US 2005/0247957 A1    Nov. 10, 2005

(30) Foreign Application Priority Data

May 7, 2004    (JP)    ............... 2004-138357

(51) Int. Cl.
    *H01L 29/76*    (2006.01)
(52) U.S. Cl. ............... 257/329; 257/341; 257/E29.148
(58) Field of Classification Search ............... 257/197, 257/327, 328, 329, 330, 331, 339, 340, 341, 257/342, E29.148, E29.149, E29.32
    See application file for complete search history.

(56) References Cited

U.S. PATENT DOCUMENTS

| | | | | |
|---|---|---|---|---|
| 4,705,759 A | * | 11/1987 | Lidow et al. | ............... 438/268 |
| 4,967,243 A | * | 10/1990 | Baliga et al. | ............... 257/342 |
| 6,870,220 B2 | * | 3/2005 | Kocon et al. | ............... 257/340 |
| 2003/0201483 A1 | | 10/2003 | Sumida | |

FOREIGN PATENT DOCUMENTS

JP    2001-298189    10/2001

OTHER PUBLICATIONS

Timothy Henson, et al., "Low Voltage Super Junction MOSFET Simulation and Experimentation", ISPSD-03 (2003), pp. 37-40.

* cited by examiner

*Primary Examiner*—Howard Weiss
*Assistant Examiner*—(Vikki) Hoa B. Trinh
(74) *Attorney, Agent, or Firm*—McGinn IP Law Group, PLLC

(57) ABSTRACT

A semiconductor device comprises a drift region of a first conduction type, a base region of a second conduction type, a source region of the first conduction type, a contact hole, a column region of the second conduction type, a plug and wiring. The drift region formed on a semiconductor substrate of the first conduction type. The base region of a second is formed in a prescribed region of the surface of the drift region. The source region is formed in a prescribed region of the surface of the base region. The contact hole extends from the source region surface side to the base region. The column region is formed in the drift region below the contact hole. The plug comprises a first conductive material and fills the contact hole. The wiring comprises a second conductive material and is electrically connected to the plug.

7 Claims, 7 Drawing Sheets

SEMICONDUCTOR DEVICE AND METHOD FOR MANUFACTURING SAME

BACKGROUND OF THE INVENTION

1. Field of the Invention

This invention relates to a semiconductor device and method for manufacturing same, and in particular relates to a MOS-type transistor with a high withstand voltage.

2. Description of the Related Art

Vertical-type power MOSFETs have been used as devices with high withstand voltages. Important characteristics of a vertical power MOSFET are the on-resistance (Ron) and the breakdown voltage (BVDSS). For a given breakdown voltage of a power MOSFET, a lower on-resistance means higher performance. There is a tradeoff between on-resistance Ron and breakdown voltage BVDSS. The on-resistance of a power MOSFET depends on the resistivity of the electric field relaxation layer (drift region).

FIG. 6 shows the structure of a typical vertical power MOSFET. In the power MOSFET shown in FIG. 6, a drift region 302, which is an electrical field relaxation layer of the same conduction type as the semiconductor substrate 301, is formed on the substrate. This drift region 302 is generally formed by epitaxial growth. A base region 308 is formed by ion implantation and thermal diffusion from the surface of the drift region 302. A conduction type of the base region 308 is opposite to that of the drift region 302. Further, a source region 309 is formed by ion implantation and thermal diffusion from the surface of the base region 308. A conduction type of the source region 309 is opposite to that of the base region 308.

A gate oxide film (gate insulating film) 306 is formed at the surface of the base region 308 between the source region 309 and the drift region 302 on the semiconductor surface. A gate electrode 307 is formed on the gate oxide film 306. A source electrode 311 is formed on the source region 309, and a drain electrode is formed on the rear surface of the semiconductor substrate. The semiconductor substrate 301 and drift region 302 are used as the drain of a MOS transistor. The channel is formed in the base region 308 below the gate oxide film.

In a power MOSFET with such a structure, when there is no gate-source bias applied to the power MOSFET and when a reverse drain-source bias is applied, the depletion layer due to the junction of the drift region 302 and the base region 308 is broadened. Hence no current flows between drain and source (the off state). Since the impurity concentration of the drift region 302 is lower than that of the base region 308, the depletion layer mainly expands on the side of the drift region 302. If the reverse bias voltage is made high and the electric field at the junction becomes equal to or greater than a certain electric field (Ecrit), avalanche breakdown causes a current to flow and results in a breakdown state. The drain-source voltage at Ecrit is BVDSS. FIG. 7 shows the junction between the drift region 302 and base region 308, which is the electric field relaxation layer, and the state at the time of electric field breakdown. If the impurity concentration in the drift region 302 is made low (if the resistivity is raised), the depletion layer during reverse bias is broadened further, and so BVDSS can be raised.

On the other hand, when a voltage is applied to the gate of the power MOSFET so as to turn on the MOSFET, the MOSFET enters the on state. At this time the path of on current flow is through the drift region 302, and so the on-resistance Ron depends on the resistance of the drift region 302. If the impurity concentration in the drift region is raised in order to lower the on-resistance Ron, BVDSS is lowered.

On the other hand, a Superjunction (SJ) structure is known as a structure in which there is no decline in BVDSS even if the resistance of the electric field relaxation layer is lowered. In this structure, by forming a region of conduction type opposite that of the drift region within the drift region, a depletion layer is formed in the drift region. In the technology disclosed in Japanese Unexamined Patent Application Publication No. 2001-298189, after epitaxial growth of Si on an Si substrate, a process of patterning and boron (B) ion implantation to form a p+ region, of conduction type opposite that of the drift region, is repeated a plurality of times.

On the other hand, in T. Henson and J. Cao, "Low Voltage Super Junction MOSFET Simulation and Experimentation", ISPSD-03 (2003), pp. 37-40, another example of a power MOSFET having a superjunction structure is described. In the technology described in Henson and Cao, a contact hole is formed extending from the substrate surface to the base region, with intermediate insulating film as a mask. In this case, the column region is formed by high-energy ion implantation after formation of the source electrode contact hole.

In a structure disclosed in Japanese Unexamined Patent Application Publication No. 2001-298189, it is necessary to repeat epitaxial growth, ion implantation and heat treatment; and the advantageous results of finer device patterns and substantial improvement in withstand voltage are diminished due to lateral broadening of the column region in consequence of mask alignment precision and thermal diffusion. There is the further disadvantage of increased costs due to the need to perform epitaxial growth a plurality of times. In the structure of Henson and Cao, the mask used in contact hole formation is also used as a mask during high-energy ion implantation, so that the contact hole must be made small. However, if in this structure the contact hole diameter is made smaller than approximately 1 μm, the metal which is to form the electrode (an aluminum alloy is principally used) cannot fill the contact hole interior, so that the on-resistance increases and other problems occur.

As described above, when forming a MOSFET as a conventional semiconductor device, there is the problem that it is difficult to employ finer device design rules while raising the breakdown voltage.

SUMMARY OF THE INVENTION

According to the first aspect of the invention, a semiconductor device comprises a drift region of a first conduction type, a base region of a second conduction type, a source region of the first conduction type, a contact hole, a column region of the second conduction type, a plug and wiring. The drift region is formed on a semiconductor substrate of the first conduction type. The base region is formed in a prescribed region of the surface of the drift region. The source region is formed in a prescribed region of the surface of the base region. The contact hole extends from the source region surface side to the base region. The column region is formed in the drift region below the contact hole. The plug comprises a first conductive material and fills the contact hole. The wiring comprises a second conductive material and is electrically connected to the plug.

According to another aspect of the invention, a method for manufacturing a semiconductor device comprises forming a drift region of a first conduction type on a semiconductor substrate of the first conduction type, forming a base region of a second conduction type in a prescribed region of the surface of the drift region, forming a source region of the first conduction type in a prescribed region of the surface of the base region, forming a contact hole extending from the source region surface side to the base region, forming a column region of the second conduction type in the drift region below the contact hole, filling the contact hole with a plug comprising a first conductive material, and forming wiring comprising a second conductive material and electrically connected to the plug.

According to another aspect of the invention, a method for manufacturing a semiconductor device comprises forming a drift region of a first conduction type on a semiconductor substrate of the first conduction type, forming a trench of prescribed depth from the surface of the drift region, forming a gate insulating film on the bottom face and side walls of the trench, forming a gate electrode layer on the gate insulating film within the trench, forming a base region of a second conduction type in the surface region of the drift region, forming a source region of the first conduction type in the surface region of the base region, with the gate electrode layer as a mask, forming an intermediate insulating film over the entirety of the semiconductor substrate, removing by selective etching the intermediate insulating film on the source region, with photoresist in a prescribed shape as a mask, forming a contact hole extending from the source region surface side to the base region, with the photoresist and intermediate insulating film as masks, introducing ions into the drift region in the contact hole bottom portion, with the photoresist and intermediate insulating film as masks, to form a column region of the second conduction type, filling the contact hole with a plug comprising a first conductive material, and forming wiring, comprising a second conductive material and electrically connected to the plug.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

Figure 1A:
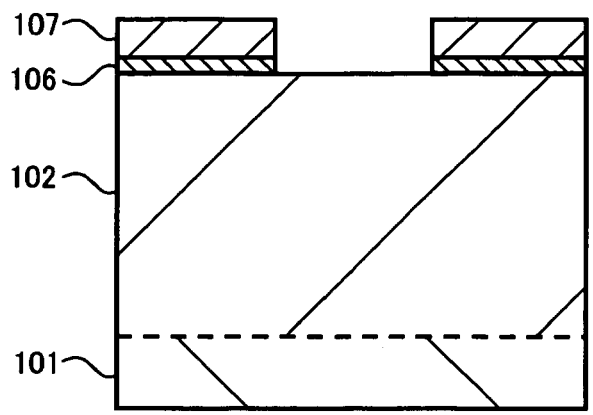
FIG. 1A to FIG. 1C are cross-sectional views showing the order of processes to manufacture a semiconductor device of a first embodiment.
Figure 1B:
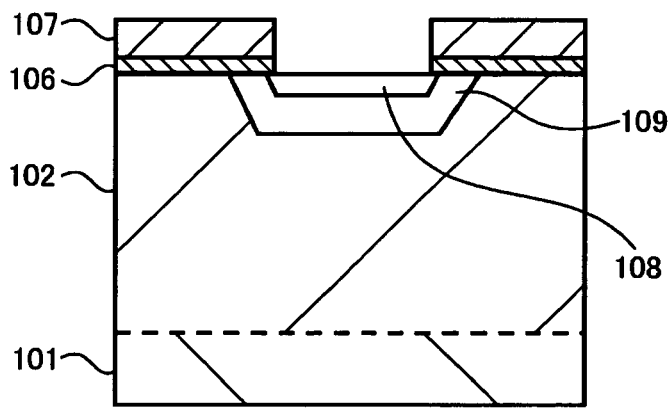
Figure 1C:
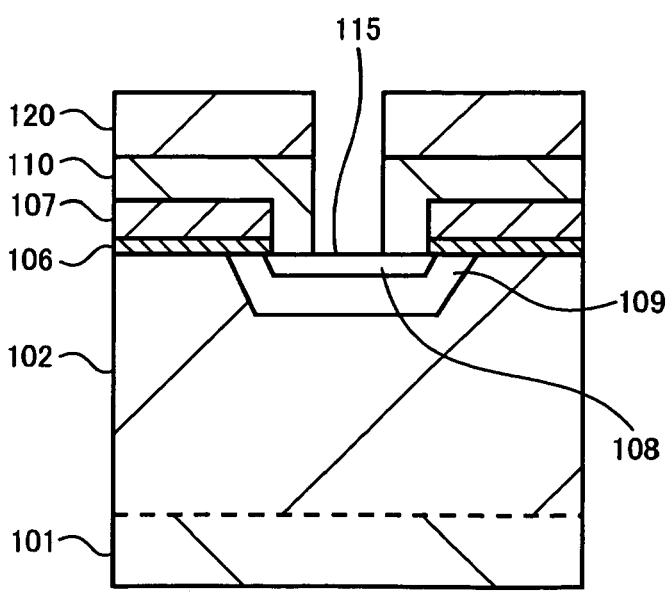

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Embodiments of the invention are explained, referring to the drawings. FIG. 1A to FIG. 1C, FIG. 2A, and FIG. 2B are cross-sectional views showing the order of processes to manufacture a semiconductor device of a first embodiment of this invention. FIG. 2B is equivalent to a summary view showing the structure of a semiconductor device of this invention. In the first embodiment, an example is explained for the case of manufacture of a power MOSFET with an n-type channel.

Figure 2A:
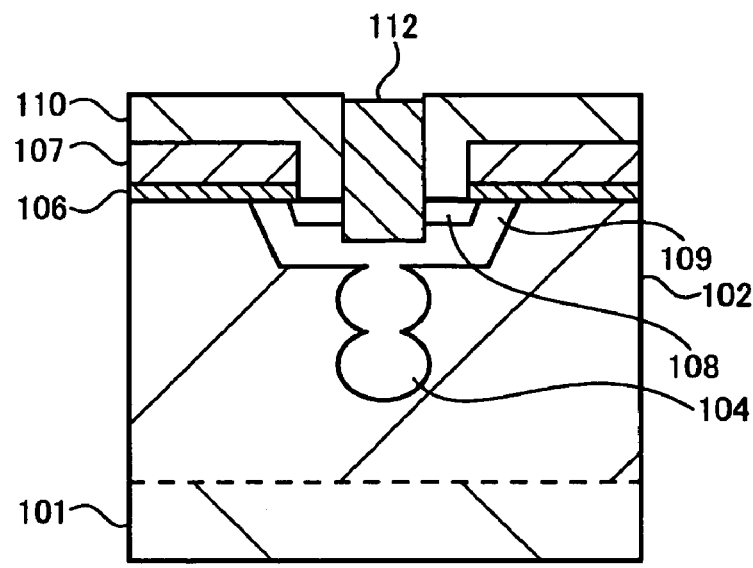
FIG. 2A, and FIG. 2B are cross-sectional views showing the order of processes to manufacture a semiconductor device of the first embodiment.
Figure 2B:
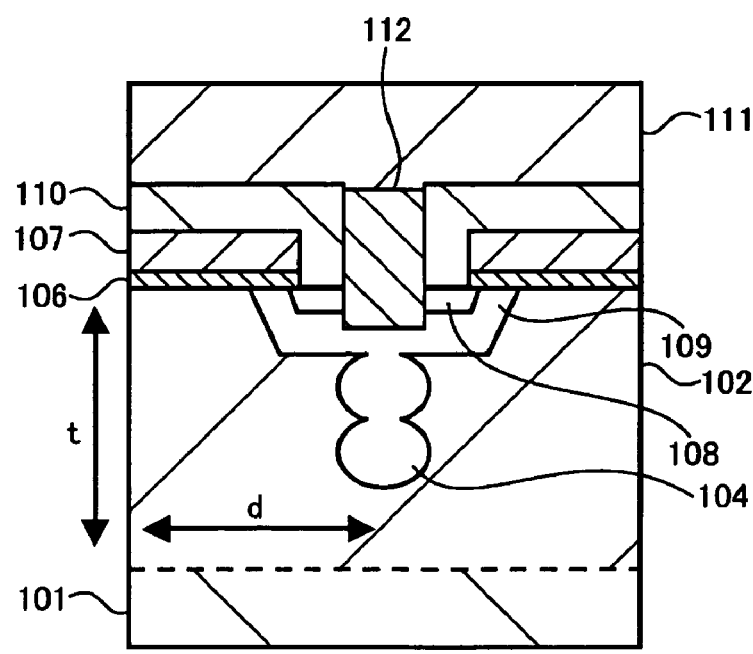

In the method of manufacture of a power MOSFET shown in FIG. 1, an n-type (n−) drift region 102 (drift region of the first conduction type) is formed on an n-type semiconductor substrate 101 (semiconductor substrate of the first conduction type) with a high impurity concentration (n+). The drift region 102 is an electric field relaxation layer. The drift region 102 is formed by epitaxial growth with phosphorus doping. The impurity concentration of this drift region 102 is lower than the impurity concentration of the semiconductor substrate 101. Next, a gate oxide film 106 (gate insulating film) is formed on the surface of the drift region 102 by thermal oxidation. Further, polysilicon 107 is formed by CVD on the gate oxide film 106 to serve as the gate electrode layer. The polysilicon 107 and gate oxide film 106 are selectively etched using photolithography techniques, to form the gate electrode 107 (see FIG. 1A).

Next, using the gate electrode 107 as a mask, self-aligned boron ion implantation is performed, followed by heat treatment. The implanted ions diffuse due to heating, so that a p-type base region 108 (base region with the second conduction type) is formed in a prescribed region at the surface of the drift region 102 within the gate electrode 107. Similarly, self-aligned arsenic ion implantation and heat treatment are performed using the gate electrode 107 as a mask, to form an n-type source region 109 (source region with the first conduction type) in a prescribed region of the surface of the base region 108. At this time, the previously formed base region 108 is formed more deeply, and the source region 109 is formed more shallowly than the base region 108 (see FIG. 1B).

Next, as an intermediate insulating film 110 extending over the entire surface of the substrate, for example a BPSG film is formed by CVD. Well-known photolithography techniques are used to selectively etch the intermediate insulating film 110. Through this etching, a portion of a contact hole 115, with aperture width approximately 0.5 μm, is formed in a prescribed portion of the source region 109. That is, a photoresist film 120 is formed having an aperture portion in a prescribed portion (the portion corresponding to the contact hole 115) of the intermediate insulating film 110, and this photoresist 120 is used as a mask to etch the intermediate insulating film 110 (see FIG. 1C).

Next, etching is performed from the surface side of the source region 109 penetrating the source region 109, to reach the base region 108, using the photoresist 120 and intermediate insulating film 110 as masks. By means of this etching, a contact hole 115 of diameter approximately 0.5 μm reaches the base region 108. Boron is implanted to this contact hole 115 by high-energy ion implantation, followed by heat treatment. By means of this boron implantation and heat treatment, a p-type column region 104 (column region with second conduction type) is formed extending below the base region 108 in FIG. 1C. This column region 104 is formed within the drift region 102 below the base region. In order to prevent boron from penetrating the intermediate insulating film 110 and entering the silicon, it is preferable that the boron implantation is performed in a state in which the photoresist 120 used in etching the intermediate insulating film 110 remains in place. Because the column region 104 is formed to be long in the vertical direction in the figure and with a uniform impurity concentration, the high-energy boron ion implantation can be performed a plurality of times, with the implantation energy changed in stages. Through this ion implantation and heat treatment, a column region 104 of width slightly greater than approximately 0.5 µm is formed within the drift region 102.

After performing boron implantation, CVD is used to deposit tungsten, which is a first conductive material, on the device surface. The tungsten film is formed by CVD, and the interior of even a comparatively small contact hole 1 µm or smaller can be sufficiently filled. By etching the entire surface of this tungsten film a prescribed thickness from the surface using anisotropic etching, a structure is obtained in which tungsten remains only within the contact hole 115. Hence the contact hole is filled with a tungsten plug 112 as a first conductive material (see FIG. 2A).

Then, sputtering is performed to form aluminum wiring, which is a second conductive material, on the substrate surface, to form the source electrode 111. This aluminum wiring is electrically connected with the tungsten plug, and the tungsten plug 112 buried in the source region 109 and base region 108 operates as a portion of the source electrode. That is, the semiconductor device of the first embodiment has, a drift region 102 formed on a semiconductor substrate 101, a base region 108 and source region 109 formed in the drift region, a contact hole 115 reaching the base region 108 from the surface side of the semiconductor substrate, a column region 104 formed below the contact hole 115, and a plug 112 of a first conductive material filling the contact hole 115 (see FIG. 2B). Though not shown in FIG. 1 and FIG. 2, the semiconductor substrate 101 has an electrode on the rear-surface side, and the electrode formed on the rear-surface side acts as a drain electrode.

Next, operation of the power MOSFET shown in FIG. 2B is explained. When there is no gate-source bias applied to the power MOSFET, that is, when no voltage is applied to the gate electrode 107, if there is a drain-source reverse bias, the depletion layer expands from three junction portions, at the drift region and base region, the drift region and column region, and the column region and substrate, so that no current flows between drain and source (the off state). In this case, the depletion layer expands from the vertical junction of the drift region 102 and column region 104, so that when the distance d in FIG. 1 (the distance from the bottom portion of the contact hole which is substantially the center in the lateral direction in FIG. 2 to the edge of the drift region) is depleted, the entirety of the drift region 102 and column region 104 is depleted. When the reverse-bias voltage is raised and the electric field at the junction becomes equal to or greater than a certain electric field (Ecrit), an avalanche breakdown causes current to flow and a breakdown state to arise. BVDSS is the drain-source voltage at Ecrit.

Figure 3:
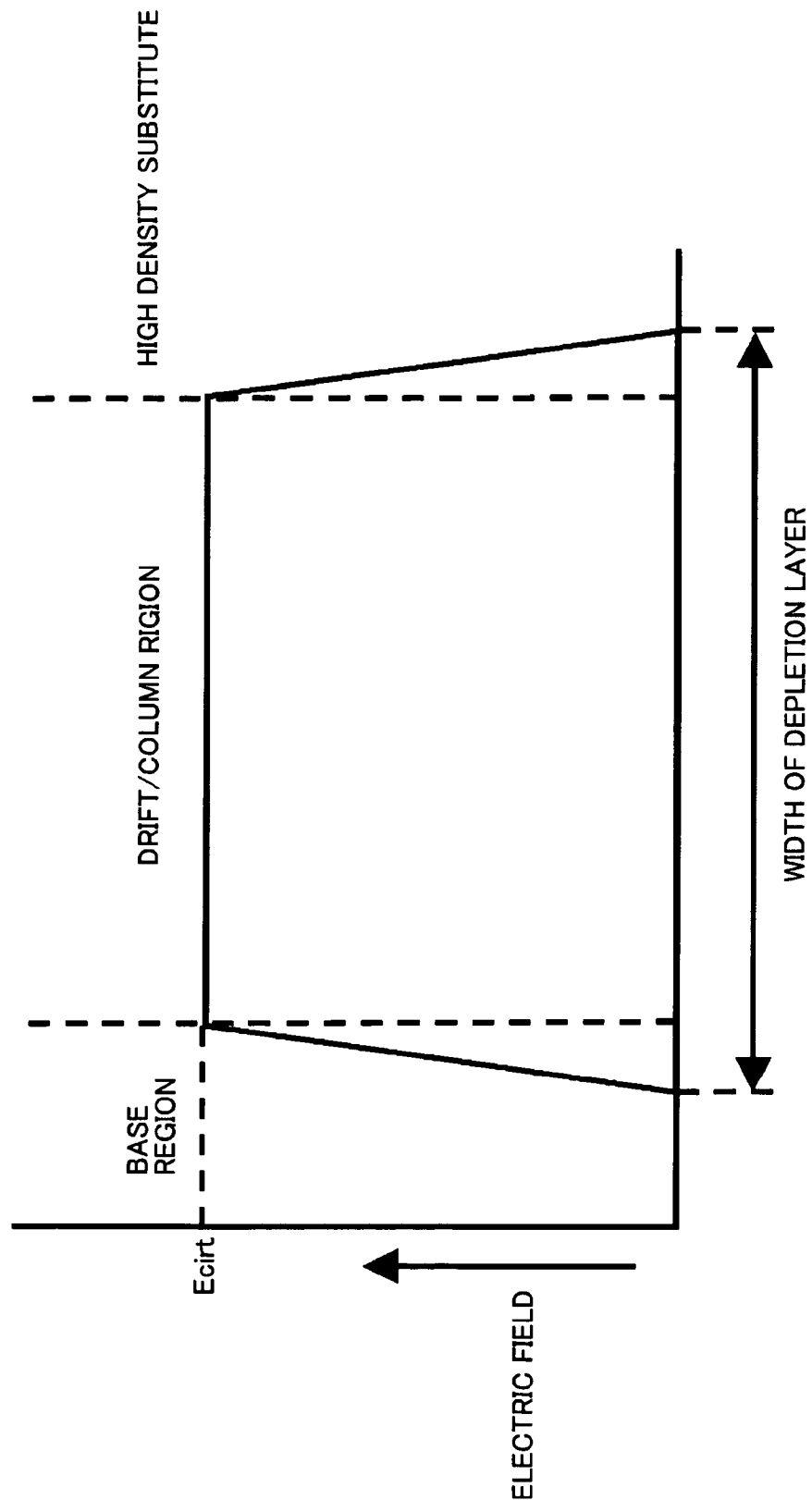
FIG. 3 shows the state of the junction of the electric field relaxation layer and electric field at breakdown in the power MOSFET.
Figure 6:
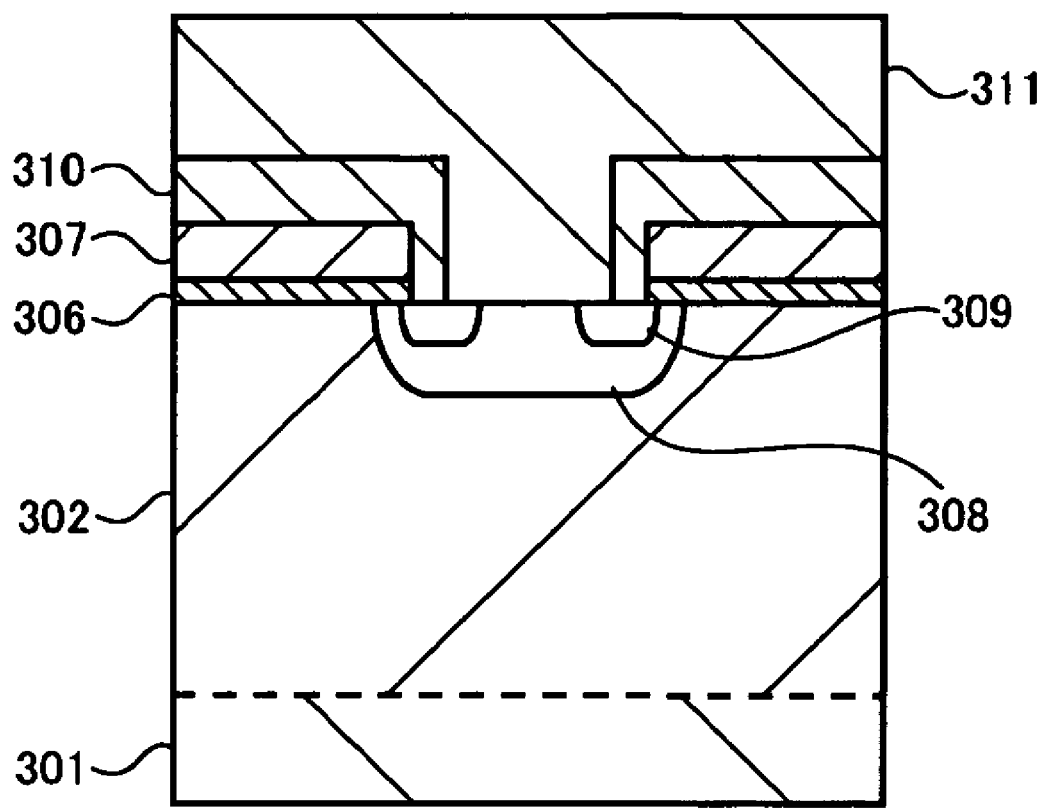
FIG. 6 shows the structure of a typical vertical power MOSFET.
Figure 7:
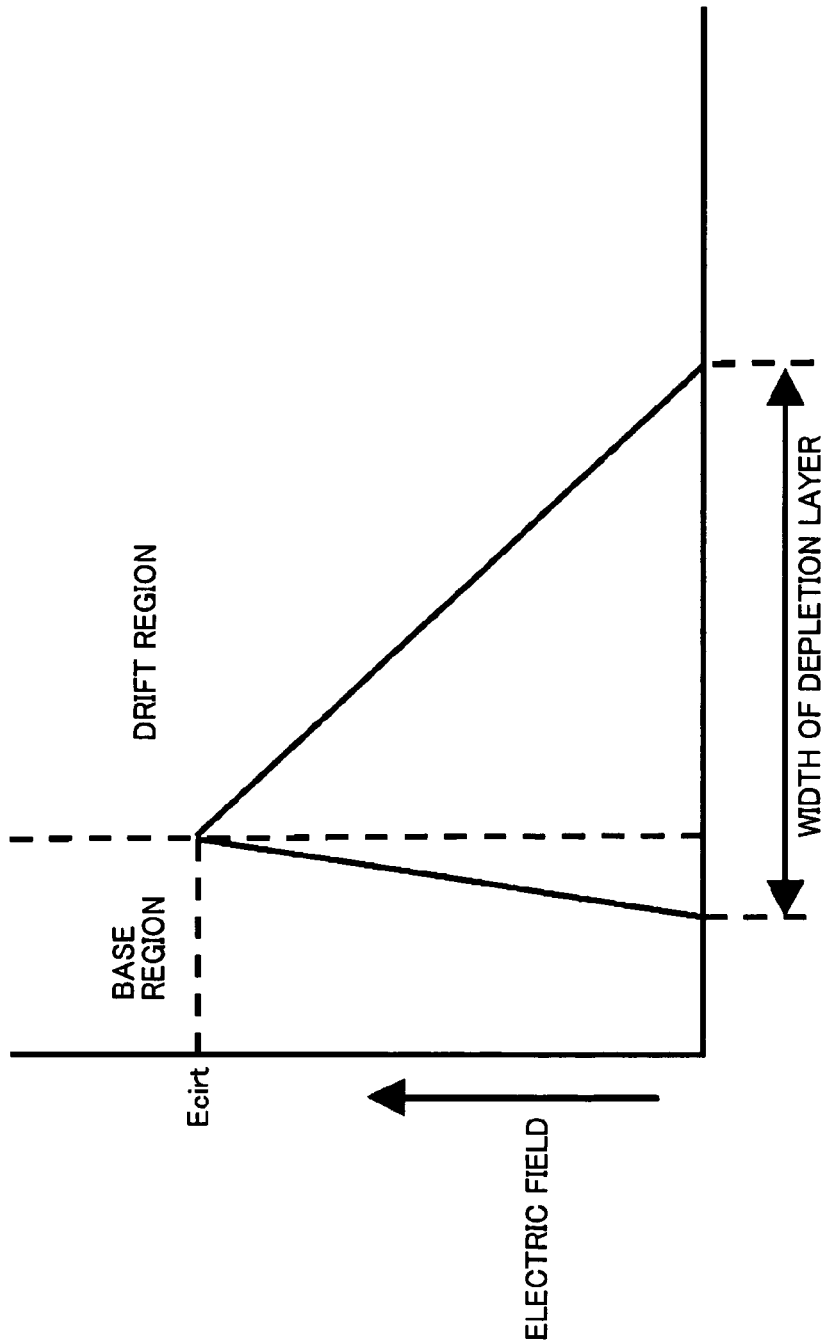
FIG. 7 shows the junction between the drift region 302 and base region 308, which is the electric field relaxation layer, and the state at the time of electric field breakdown.

FIG. 3 shows the state of the junction of the electric field relaxation layer and electric field at breakdown in the power MOSFET of the first embodiment. BVDSS for the conventional power MOSFET shown in FIG. 6 is determined by the impurity concentration of the drift region 302 which is the electric field relaxation layer, but the BVDSS of the power MOSFET in FIG. 2B of this invention is determined by the value of the distance t (the thickness of the drift region; see FIG. 2B) if the above-described distance d is small enough. Consequently, if the distance d is sufficiently small, BVDSS for the power MOSFET of FIG. 2B no longer depends on the impurity concentration of the electric field relaxation layer 102. Hence the impurity concentration of the drift region 102 can be made high (the resistance can be lowered) to lower the on-resistance Ron, while maintaining BVDSS. A device provided with such a vertically striated junction, and with a structure designed for a high BVDSS and low Ron, is called a superjunction device.

When a prescribed positive voltage is applied as a bias across the gate and source of the power MOSFET of FIG. 2B, the surface of the base region assume inverted states, and a channel is formed. As a result, current flows according to the drain-source voltage (on state). The on-resistance Ron depends on the resistivity of the drift region; because the impurity concentration of the drift region is set high in order to lower Ron, the on-resistance Ron can be reduced.

In the structure of the first embodiment of this invention, the column region 104 is formed by using an intermediate insulating film and photoresist 120 for a contact formation pattern as masks to perform high-energy ion implantation from the contact hole aperture portion; hence compared with a conventional structure in which ion implantation is repeated in multilayer epitaxial growth, the number of photolithography processes is small, and so spreading to the sides of the column region 104 due to mask shifts can be suppressed. Further, because the number of heat treatments to which the column region 104 is subjected is small, lateral-direction diffusion of the column region 104 is reduced. And because the aperture width of the contact hole 115 formed in the source region 109 and base region 108 can be made not more than 0.5 µm, the column region 104 can be reduced in the width direction (the horizontal direction in FIG. 1 and FIG. 2). Moreover, by reducing the width d shown in FIG. 2B, a depletion layer can easily be induced in the junction portion between semiconductor regions with different conduction types. That is, the advantageous results of a superjunction can be further augmented. Hence the line width of the device itself can be reduced while maintaining a sufficiently high breakdown voltage, and a finer design rule becomes possible. Further, in the manufacturing method of the first embodiment, epitaxial growth is performed only once, so that increases in costs can also be prevented.

Next, drawings are used to explain the second embodiment of the invention. FIG. 4A to FIG. 4C, FIG. 5A, and FIG. 5B are cross-sectional views of an n-channel power MOSFET, explaining the procedure of manufacturing processes in the second embodiment of the invention. Unless there is an explanation otherwise, each process is similar to that performed in the first embodiment.

Figure 4A:
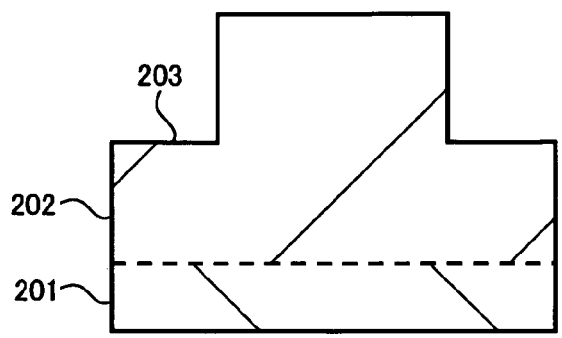
FIG. 4A to FIG. 4C are cross-sectional views showing the order of processes to manufacture a semiconductor device of a second embodiment.
Figure 4B:
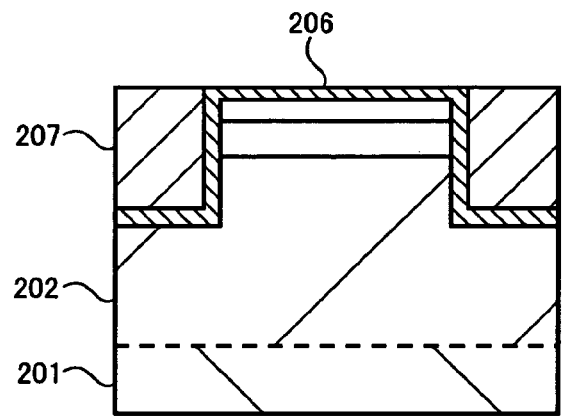
Figure 4C:
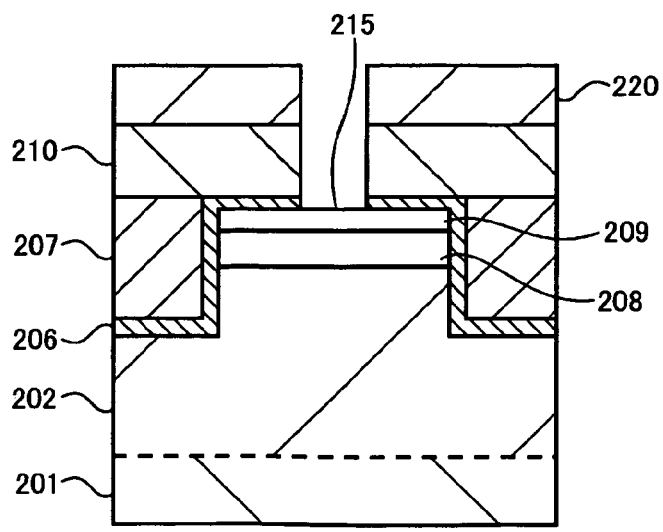

In the power MOSFET shown in FIG. 4A, an n-type drift region 202 to be the electric field relaxation layer is formed by phosphorus-doped epitaxial growth on a high-concentration n-type semiconductor substrate 201. The second embodiment differs from the first embodiment in that, by selective etching of the drift region 202 using photolithography techniques, a trench portion 203 is formed (see FIG. 4A). Then, thermal oxidation is used to form a gate oxide film 206 on the surface of the drift region 202 and on the side walls and bottom face of the trench portion 203 formed as described above. Thereafter, CVD is used to form polysilicon 207 as a gate electrode layer on the semiconductor substrate surface side. The polysilicon 207 is etched back over its entire surface, to obtain a structure in which polysilicon remains only in the trench portion. In the second embodiment, the gate electrode 207 is formed to fill the trench portion 203 formed within the drift region.

Next, the gate electrode 207 is used as a mask in self-aligned boron ion implantation, followed by heat treatment. Implanted ions diffuse as a result of heating, and a p-type base region 208 is formed on the surface side of the drift region 202. Then, the gate electrode 207 is used as a mask in self-aligned arsenic implantation followed by heat treatment, to form an n-type source region 209 on the surface side of the base region 208 (see FIG. 4B).

Then, CVD for example is used to form a BPSG film as an intermediate insulating film 210 over the entire substrate surface. Following this, similarly to the first embodiment, photoresist 220 is used in selective etching of the BPSG film 210, to form a portion of a contact hole 215 the width of the aperture portion of which is approximately 0.5 µm. This contact hole is formed in a prescribed portion of the region in which the base region 208 and source region 209 are formed (see FIG. 4C).

Next, similarly to the first embodiment, the photoresist 220 and intermediate insulating film 210 (BPSG film) are used as masks to perform etching from the silicon surface, extending to the base region 208. By means of this etching, the contact hole reaches the base region 208. High-energy boron ion implantation into this contact hole is performed, followed by heat treatment. By means of this boron implantation and heat treatment, a p-type column region 204 is formed below the base region 208. For reasons similar to those explained in the first embodiment, this boron implantation is performed in a state in which the photoresist 220 used in etching the intermediate insulating film 210 remains. Because the column region 204 is formed over a long distance in the vertical direction and with uniform impurity concentration, the high-energy ion implantation can be performed a plurality of times, with the implantation energy changed in stages. By means of the ion implantation and heat treatment, a column region 204 having a width of slightly greater than approximately 0.5 µm is formed within the drift region.

After boron implantation, CVD is used to deposit tungsten, which is a first conductive material, on the device surface. A tungsten film is formed by CVD, and the interior of even a contact hole with a comparatively small aperture portion width can be sufficiently filled. By etching back the entire surface of the tungsten film using anisotropic etching, a structure is obtained in which tungsten remains only in the interior of the contact hole. These processes are similar to those of the first embodiment. Hence the contact hole is filled with a plug 212 of tungsten, which is a first conductive material (see FIG. 5A).

Then, sputtering is used to form an aluminum film, which is a second conductive material, on the substrate surface, to form the source electrode 211. This aluminum film is electrically connected to the tungsten, and the tungsten plug buried in the semiconductor substrate operates as a portion of the source electrode. That is, similarly to the first embodiment, the semiconductor device of the second embodiment has a drift region 202, base region 208, source region 209, contact hole, column region 204 formed below the contact hole, and plug 212 which fills the contact hole. Further, because in the second embodiment the gate electrode 207 fills a trench in the drift region 202, a structure is obtained in which the gate electrode is positioned on side faces of the base region 208 and source region 209 (see FIG. 5B).

Figure 5A:
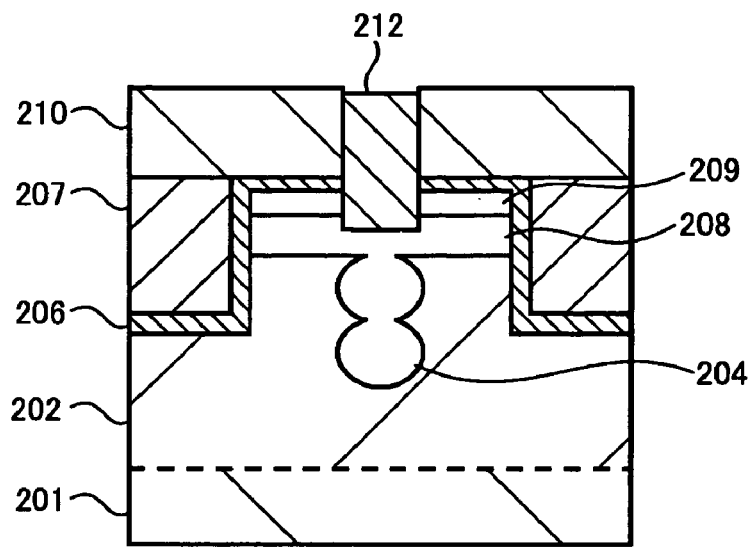
FIG. 5A, and FIG. 5B are cross-sectional views showing the order of processes to manufacture a semiconductor device of the second embodiment.
Figure 5B:
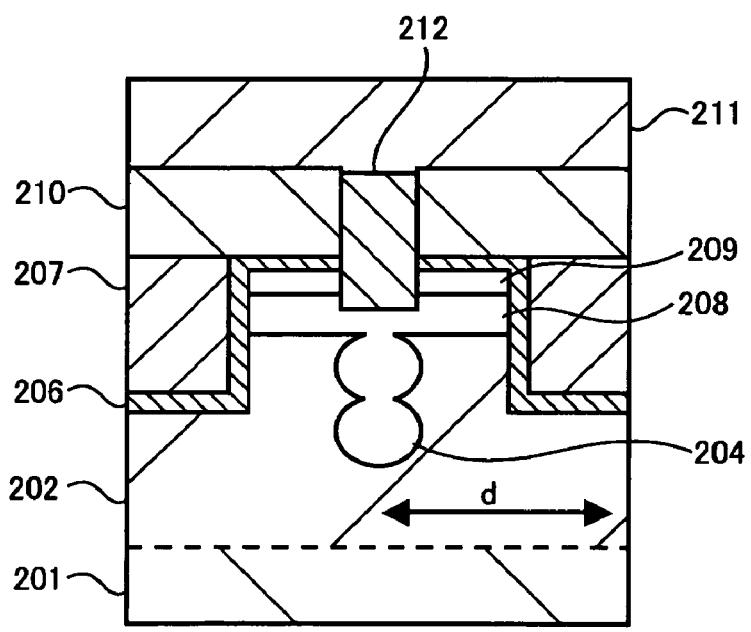

Next, operation of the power MOSFET shown in FIG. 5B is explained. When there is no gate-source bias applied to the power MOSFET, that is, when no voltage is applied to the gate electrode 207, if there is a drain-source reverse bias, the depletion layer expands from three junction portions, at the drift region and base region, the drift region and column region, and the column region and substrate, so that no current flows between drain and source (the off state). In this case, the depletion layer expands from the vertical junction of the drift region and column region, so that when the distance d in FIG. 5B (the distance from the bottom portion of the contact hole which is substantially the center in the lateral direction in FIG. 4 to the edge of the drift region) is depleted, the entirety of the drift region 202 and column region 204 is depleted.

When a prescribed positive voltage is used to bias the gate and source of the power MOSFET in FIG. 5B, the surface of the base region 208 is in an inverted state, and a channel is formed. In this case, because the gate electrode 207 is buried in a trench, a channel in the base region 208 is formed in the vertical direction in the figure. As a result, a current flows according to the drain-source voltage (the on state). The on-resistance Ron depends on the resistivity of the drift region 202, and because the impurity concentration of the drift region 202 is set high in order to lower the on-resistance Ron, the on-resistance Ron can be lowered.

In the second embodiment, the gate electrode 207 is formed in a trench formed in the drift region 202. When adopting a gate electrode 207 with such a structure, the source-drain channel is formed in the vertical direction in FIG. 5B along the side walls of the trench electrode 207. Such a structure is advantageous in a power MOSFET of the class having a BVDSS of 100 V or below.

By means of the semiconductor device of the second embodiment, in addition to advantageous results similar to those of the first embodiment, because the channel is formed in the vertical direction along the side walls of the trench, the lateral-direction size in FIG. 5 can be further reduced. Consequently the width d which determines the performance of the superjunction device can be further decreased. Hence the breakdown voltage can be stabilized.

As explained in detail above, a superjunction structure can easily be formed by means of the structure and method of manufacture of this invention. By means of the structure of this invention, the device design rules can be made finer, and the device width, which is one factor determining the characteristics of the superjunction structure, can be reduced. As a result the depletion layer can be formed reliably, and the device breakdown voltage can be stabilized.

In this aspect of the invention, an explanation was given for a case in which tungsten is used as the first conductive material; but any conductive material which, similarly to tungsten, can sufficiently fill a contact hole with the prescribed aperture width can be used to obtain the advantageous results of this invention.

In this aspect, a structure is employed in which no barrier metal is provided between the tungsten film, substrate, and aluminum wiring; but a process can be added in which a barrier metal appropriate to the purpose such as TiN is provided as a layer below or above the tungsten.

It is apparent that the present invention is not limited to the above embodiment, that may be modified and changed without departing from the scope and spirit of the invention.

What is claimed is:

1. A semiconductor device comprising:
   a drift region of a first conduction type, formed on a semiconductor substrate;
   a base region of a second conduction type formed in a prescribed region of the drift region;
   a source region of the first conduction type formed in a prescribed region of the base region;
   a contact hole formed in the base region;
   a column region of the second conduction type formed in the drift region below the contact hole;
   a plug of a conductive material filling the contact hole; and, a wiring comprising a conductive material and electrically connected to the plug.

2. The semiconductor device according to further comprising a gate electrode formed over the base region, with a gate insulating film intervening.

3. The semiconductor device according to further comprising a gate electrode formed in each of the base region and the drift region with a gate insulating film intervening.

4. The semiconductor device according to claim 1, wherein the plug connects to the base region at a bottom of the plug.

5. The semiconductor device according to claim 3, wherein the gate electrode is formed in the source region with the gate insulating film intervening.

6. The semiconductor device according to claim 1, wherein the conductive material of the plug comprises tungsten.

7. The semiconductor device according to claim 6, wherein the conductive material of the wiring comprises aluminum.

* * * * *